United States Patent
Niu et al.

(10) Patent No.: US 10,050,151 B2
(45) Date of Patent: Aug. 14, 2018

(54) DUAL-GATE TFT ARRAY SUBSTRATE AND MANUFACTURING METHOD THEREOF, AND DISPLAY DEVICE

(71) Applicant: BOE Technology Group Co., Ltd., Beijing (CN)

(72) Inventors: Jing Niu, Beijing (CN); Xiaogai Chun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/276,339

(22) Filed: Sep. 26, 2016

(65) Prior Publication Data

US 2017/0213916 A1 Jul. 27, 2017

(30) Foreign Application Priority Data

Jan. 21, 2016 (CN) .......................... 2016 1 0040520

(51) Int. Cl.
| | |
|---|---|
| *H01L 27/14* | (2006.01) |
| *H01L 21/00* | (2006.01) |
| *H01L 21/84* | (2006.01) |
| *H01L 29/786* | (2006.01) |
| *H01L 27/12* | (2006.01) |
| *H01L 29/66* | (2006.01) |

(52) U.S. Cl.
CPC ........ *H01L 29/7869* (2013.01); *H01L 27/124* (2013.01); *H01L 27/1225* (2013.01); *H01L 27/1262* (2013.01); *H01L 27/1288* (2013.01); *H01L 29/66969* (2013.01); *H01L 29/78648* (2013.01)

(58) Field of Classification Search
CPC .................................................. H01L 29/78645
USPC ............................................ 257/72; 438/157
See application file for complete search history.

(56) References Cited

U.S. PATENT DOCUMENTS

| | | | | |
|---|---|---|---|---|
| 5,731,116 | A * | 3/1998 | Matsuo ..................... | G11B 9/08 386/E5.055 |
| 8,878,173 | B2 * | 11/2014 | Yamazaki ........... | H01L 27/1225 257/43 |
| 2006/0108587 | A1 * | 5/2006 | Lee ..................... | G02F 1/13439 257/72 |
| 2006/0110866 | A1 * | 5/2006 | Gan .................. | H01L 29/66765 438/151 |
| 2010/0320459 | A1 | 12/2010 | Umeda et al. | |

(Continued)

FOREIGN PATENT DOCUMENTS

| | | |
|---|---|---|
| CN | 101931009 A | 12/2010 |
| CN | 102473736 A | 5/2012 |

(Continued)

OTHER PUBLICATIONS

Dec. 20, 2017—(CN) First Office Action Appn 201610040520.4 with English Tran.

(Continued)

*Primary Examiner* — Igwe U Anya
(74) *Attorney, Agent, or Firm* — Banner & Witcoff, Ltd.

(57) ABSTRACT

A dual-gate TFT array substrate and manufacturing method thereof and a display device are provided. The manufacturing method includes: forming a common electrode and a top-gate electrode through one patterning process. The manufacturing method reduces the times of patterning process and simplifies the process flow.

5 Claims, 8 Drawing Sheets

(56) References Cited

U.S. PATENT DOCUMENTS

| | | |
|---|---|---|
| 2011/0193053 A1* | 8/2011 | Roca I Cabarrocas ........................ B82Y 10/00 257/9 |
| 2012/0146043 A1 | 6/2012 | Kitakado |
| 2013/0001546 A1 | 1/2013 | Kamada et al. |
| 2014/0339543 A1 | 11/2014 | Yamazaki et al. |
| 2015/0076492 A1* | 3/2015 | Kubota ............... H01L 27/1225 257/43 |
| 2016/0197196 A1* | 7/2016 | Oh ....................... H01L 27/1248 257/66 |
| 2016/0268317 A1 | 9/2016 | Wang |

FOREIGN PATENT DOCUMENTS

| | | | |
|---|---|---|---|
| CN | 102822884 A | | 12/2012 |
| CN | 103456744 A | | 12/2013 |
| CN | 104269414 A | | 1/2015 |
| CN | 104934449 A | | 9/2015 |
| JP | 63264816 A | * | 11/1988 |
| JP | S63264816 A | | 11/1988 |

OTHER PUBLICATIONS

Mar. 22, 2018—(CN) Second Office Action Appn 201610040520.4 with English Tran.

\* cited by examiner

DUAL-GATE TFT ARRAY SUBSTRATE AND MANUFACTURING METHOD THEREOF, AND DISPLAY DEVICE

This application claims priority to and the benefit of Chinese Patent Application No. 201610040520.4 filed on Jan. 21, 2016, which application is incorporated herein in its entirety.

TECHNICAL FIELD

Embodiments of the present disclosure relate to a manufacturing method of a dual-gate TFT array substrate, a dual-gate TFT array substrate and a display device.

BACKGROUND

In the field of liquid crystal display, an active layer of a thin film transistor is usually made of a silicon material with excellent stability performance and processing performance. The silicon material mainly includes an amorphous silicon material and a polycrystalline silicon material, and carrier mobility of the amorphous silicon material is very low. Although carrier mobility of the polycrystalline silicon material is high, the devices made of polycrystalline silicon materials have poor uniformity, low yield, and high unit price. Thus in recent years, the technology of using a transparent oxide semiconductor film in a channel forming region to form a thin film transistor (TFT) and applying the TFT in an electronic device or an optical device has received wide attention. A field effect transistor made of an amorphous In—Ga—Zn—O system material (a-IGZO) consisting of indium, gallium, zinc and oxygen has attracted most attention because of its high carrier mobility and large switching ratio. However, a-IGZO has an amorphous structure, and its performance is very unstable, so it is very important to improve the stability of an oxide semiconductor device. There have been proposed many methods to improve the stability of oxide semiconductor, and for example application of an upper and lower dual-gate structure is an effective method.

The oxide semiconductor device having a dual-gate structure can be manufactured by adding a metal layer as a top-gate electrode at the top of the TFT region of a conventional back channel etching (BCE) structure or an etching stop layer (ESL) structure. One patterning process for the metal layer and a deposition process for an insulating layer for protecting the metal are added to form the structure. The steps of forming the TFT of a dual-gate structure are increased, and the technology of forming the TFT of a dual-gate structure is complex.

SUMMARY

In a first aspect, an embodiment of the present disclosure provides a manufacturing method of a dual-gate thin film transistor (TFT) array substrate, and the method comprises: forming a common electrode and a top-gate electrode through one patterning process.

For example, in an example of the embodiments, before forming the common electrode and the top-gate electrode, the method further comprises: forming a bottom-gate electrode and a gate line on the substrate; forming a gate insulating layer on the bottom-gate electrode and the gate line; forming an active layer on the gate insulating layer; forming a source electrode and a drain electrode on the active layer; and forming a first passivation layer on the source electrode and the drain electrode. The common electrode and the top-gate electrode are formed on the first passivation layer.

In a second aspect, an embodiment of the present disclosure provides a dual-gate TFT array substrate, and the dual-gate TFT array substrate comprises a common electrode and a top-gate electrode, and the common electrode and the top-gate electrode are disposed in a same layer.

In a third aspect, an embodiment of the present disclosure provides a display device, and the display device comprises the above dual-gate TFT array substrate.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the words such as "comprising", "include", etc., mean the components or objects that appear in front of the words to cover the similar components or objects that are listed in the following of the words, but other different components or objects are not excluded. The phrases "connect", "connected", etc., are not intended to define a physical connection or mechanical connection, but may include an electrical connection, directly or indirectly. The terms "up", "down", "left", "right", etc., are used to indicate the relative position relation, when the absolute position of the described object is changed, the relative position relation may also be changed accordingly.

Figure 1:
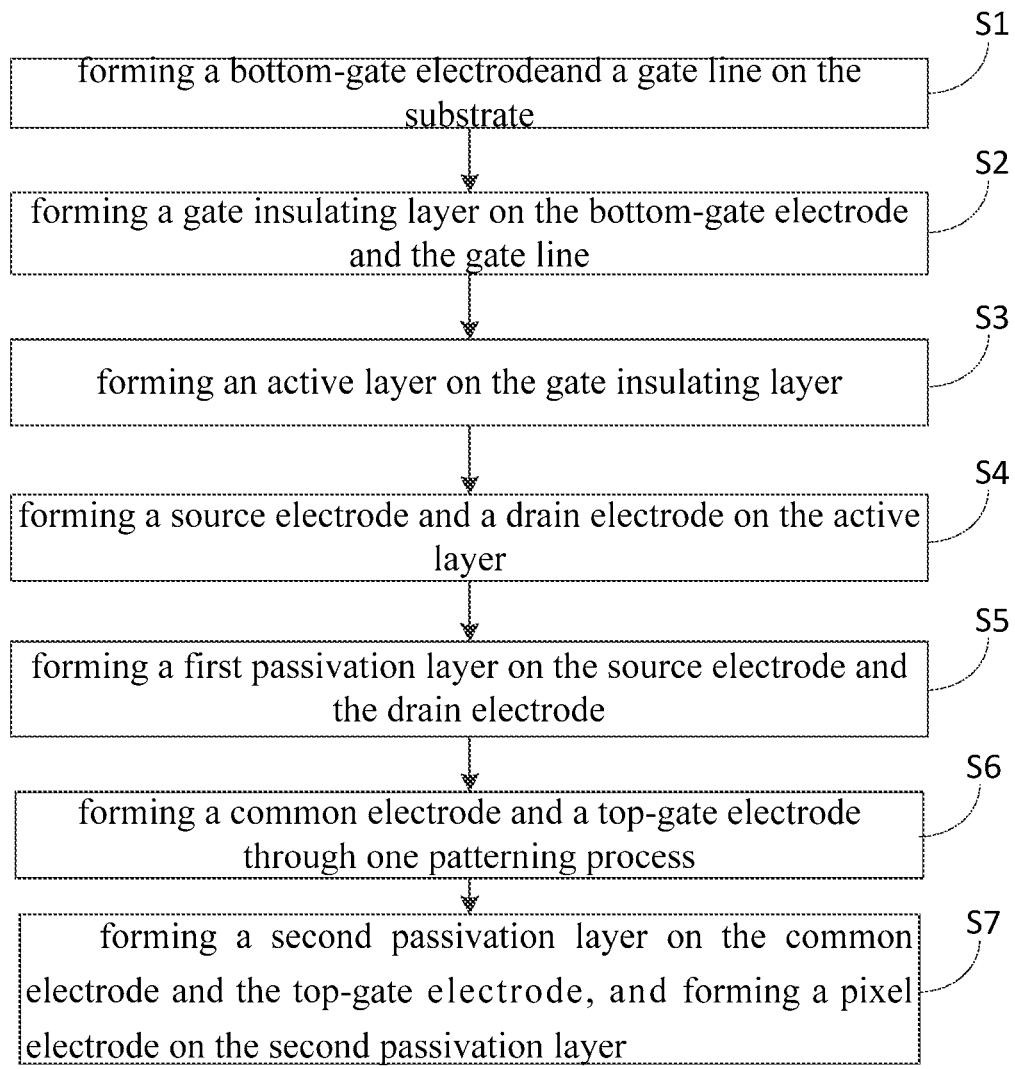
FIG. 1 is a flow diagram of a manufacturing method of a dual-gate TFT array substrate provided by an embodiment of the present disclosure.

As shown in FIG. 1, the manufacturing method of a dual-gate TFT array substrate provided by an embodiment of the present disclosure comprises the following operation:

S6: forming a common electrode and a top-gate electrode through one patterning process.

The manufacturing method of the common electrode and the top-gate electrode shown in FIG. 6 to FIG. 13 comprises depositing a transparent metal oxide layer 11 (for example: indium tin oxide) on a first passivation layer 5. The common electrode 1 and the top-gate electrode 2 are formed on the metal oxide layer through a single patterning process. Compared with the conventional method of forming the common electrode 1 first and then forming the top-gate electrode 2 in two patterning processes, the method provided by the embodiment reduces the times of patterning process, and simplifies the process flow.

Figure 3:
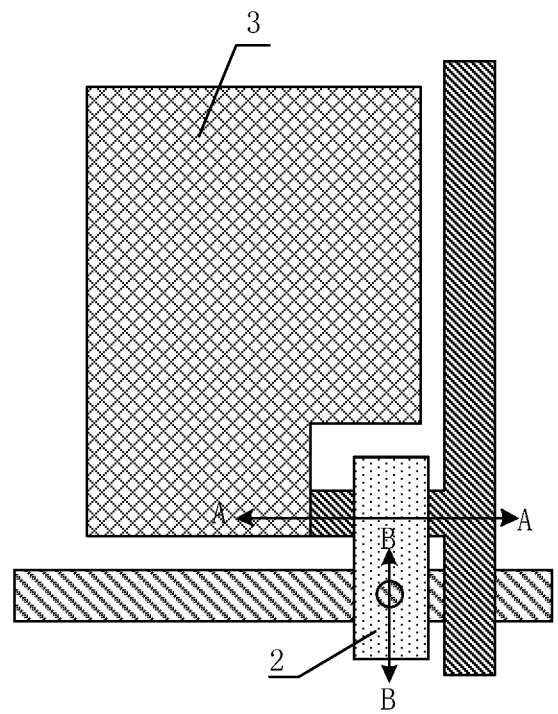
FIG. 3 is a schematic structure diagram of a dual-gate TFT array substrate provided by an embodiment of the present disclosure.
Figure 4:
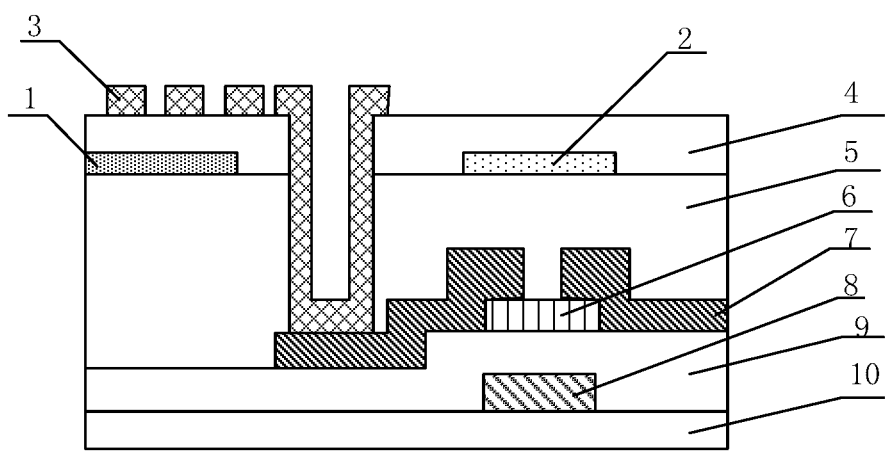
FIG. 4 is a longitudinal sectional diagram of the dual-gate TFT array substrate along direction A-A in FIG. 3.

In an example, as shown in FIG. 1, FIG. 3 and FIG. 4, before forming the common electrode and the top-gate electrode, the manufacturing method further comprises the following steps S1~S5:

S1: forming a bottom-gate electrode and a gate line 8 on the substrate 10;

S2: forming a gate insulating layer 9 on the bottom-gate electrode and the gate line 8;

S3: forming an active layer 6 on the gate insulating layer 9;

S4: forming source/drain electrodes 7 on the active layer 6; and

S5: forming a first passivation layer 5 on the source/drain electrodes 7.

The common electrode 1 and the top-gate electrode 2 are formed on the first passivation layer 5.

Figure 5:
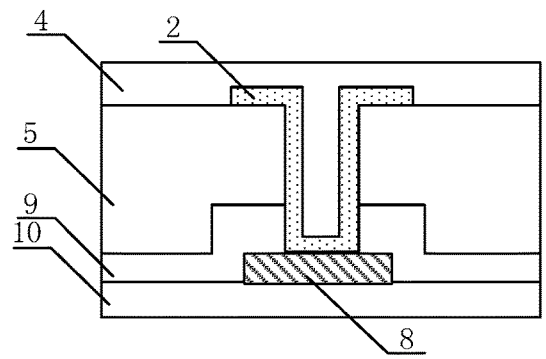
FIG. 5 is a longitudinal sectional diagram of the dual-gate TFT array substrate along direction B-B in FIG. 3.

In an example, as shown in FIG. 3 and FIG. 5, the above method further comprises: forming a via hole at a region corresponding to the gate line 8 in the first passivation layer 5 and the gate insulating layer 9. The top-gate electrode 2 and the gate line 8 are connected through the via hole. Because the gate line is connected with the bottom-gate electrode, after the top-gate electrode and the bottom-gate electrode are connected through the via hole, both the top-gate electrode and the bottom-gate electrode are connected to the gate line. Therefore, in the case that a scanning signal is transmitted by the gate line, the top-gate electrode and the bottom-gate electrode in a same pixel unit can receive the scanning signal simultaneously, further it can ensure that a drive effect can be realized through the active layer at the same time.

In an example, the above method may further comprise the following step S7:

S7: forming a second passivation layer 4 on the common electrode 1 and the top-gate electrode 2, and forming a pixel electrode 3 on the second passivation layer 4, as shown in FIG. 3. The embodiment is suitable for the array substrate with a structure of In-Plane Switching (IPS) or Advanced Super Dimension Switching (ADS).

For example, the active layer 6 of the dual-gate TFT array substrate is made of IGZO (transparent indium gallium zinc oxide), so that the active layer has high carrier mobility and a large switching ratio. However, the IGZO material has an amorphous structure, and its performance is very unstable. According to the dual-gate structure in the above embodiment, the stability of the active layer made of IGZO can be improved.

For example, the common electrode 1 is made of a transparent metal oxide (form example: transparent indium tin oxide (ITO)), the process of forming the common electrode and the top-gate electrode may comprise: reducing the top-gate electrode. The reduction process, for example, comprises introducing a reduction gas such as hydrogen or carbon monoxide at the reaction temperature, and the reduction gas reacts with the transparent metal oxide of the original top-gate electrode to take out the oxygen elements in the transparent metal oxide, then the metal layer for the top-gate electrode is formed. After the reduction treatment, compared with the common electrode without being subjected to a reduction treatment, for example the content of the metal component in the top-gate electrode is increased relatively and even a metal top-gate electrode is obtained, so the resistivity of the top-gate electrode is decreased.

Because both the bottom-gate electrode and the gate line are made of a metal material, the resistance of the top-gate electrode is similar to the resistance of the bottom-gate electrode in the embodiment by reducing the transparent metal oxide to obtain a metal layer for the top-gate electrode, it can ensure that the voltages applied to the two gate electrodes are similar to each other when the TFT is applied electrical signals and the active layer is subjected to a symmetrical gate effect, so that the active layer connects with the source electrode and the drain electrode more stably.

In another respect, the common electrode is not reduced in the reduction process of the top-gate electrode in the embodiment. As the pixel electrode is made of a transparent metal oxide conductive material and the common electrode not reduced is also made of a transparent metal oxide conductive material, it can be ensured that the common electrode and the pixel electrode are made of the same conductive material. Thus the common electrode and the pixel electrode have similar electrical characteristics, and the common electrode and the pixel electrode can be controlled collectively more easily.

Figure 2:
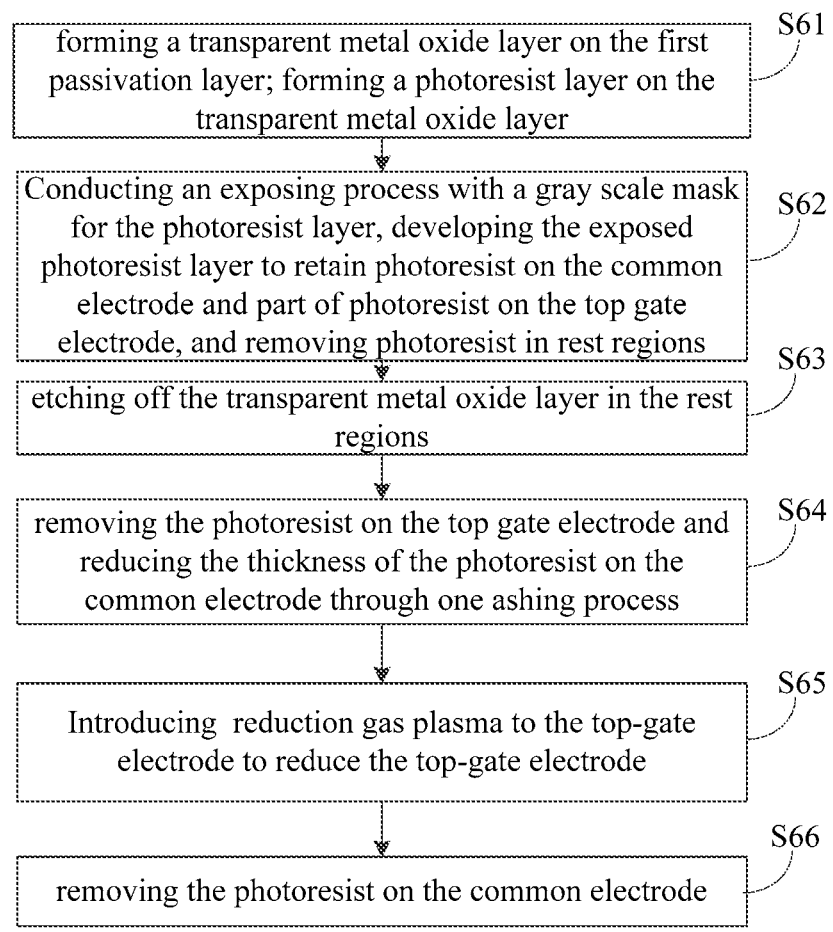
FIG. 2 is a flow diagram of a manufacturing method of a common electrode and a top-gate electrode provided by an embodiment of the present disclosure.
Figure 6:
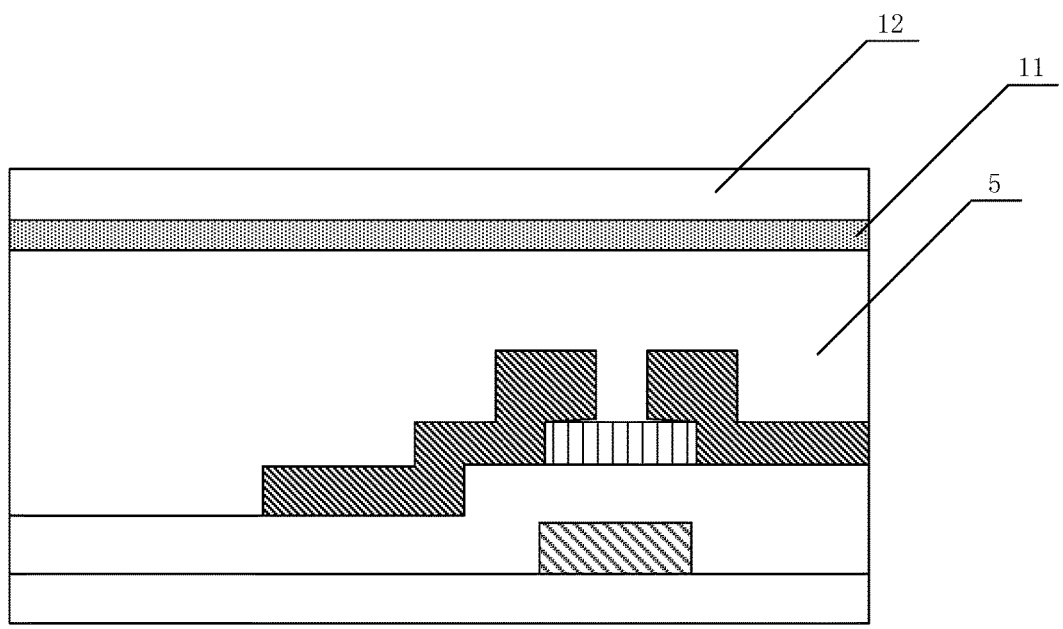
FIG. 6~FIG. 13 are schematic diagrams of the manufacturing process of a common electrode and a top-gate electrode on a dual-gate TFT array substrate provided by an embodiment of the present disclosure.
Figure 7:
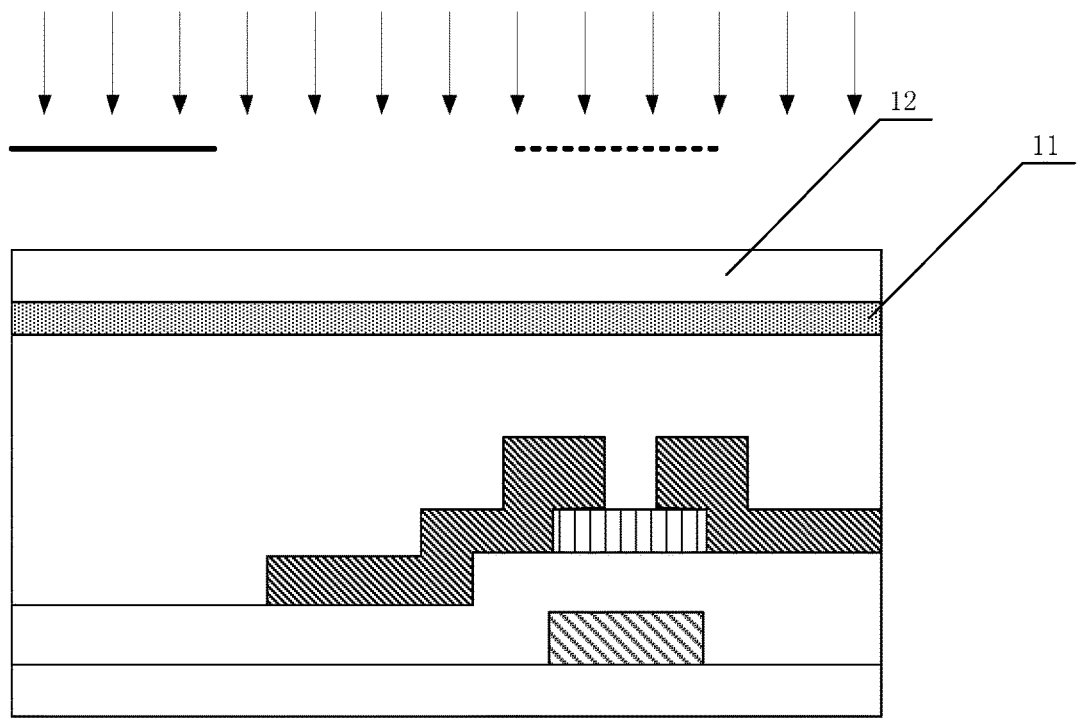
Figure 8:
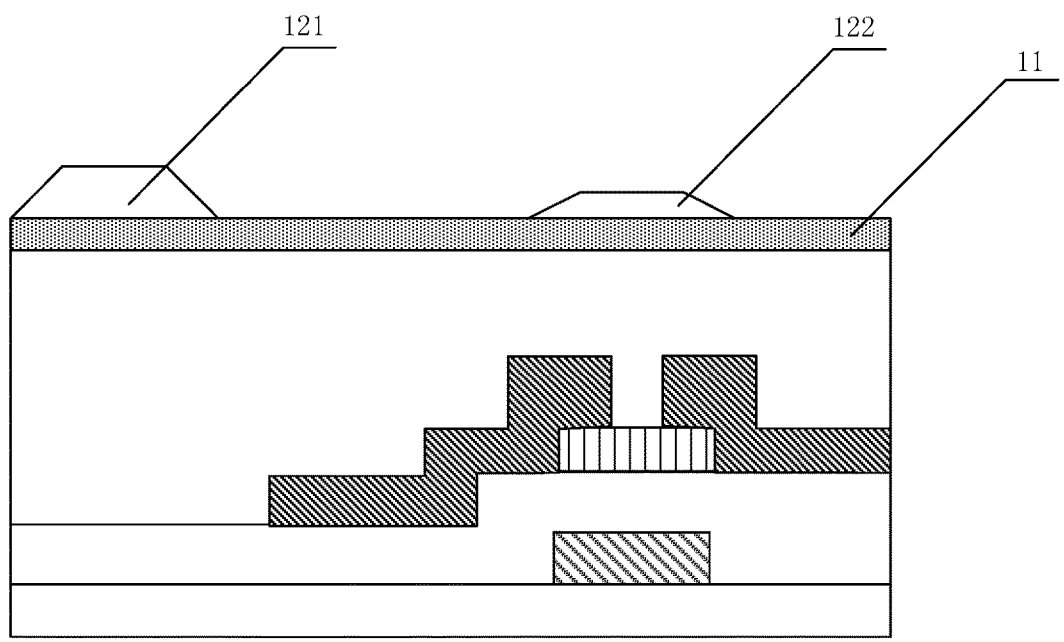

As shown in FIG. 2, an example for forming the common electrode and the top-gate electrode comprises the following steps S61~S65:

S61: forming the transparent metal oxide layer 11 on the first passivation layer 5, and forming a photoresist layer 12 on the transparent metal oxide layer 11, as shown in FIG. 6.

S62: conducting an exposing process with a half tone mask for the photoresist layer 12, developing the exposed photoresist layer to retain the photoresist in the first region 121 and to retain part of the photoresist in the second region 122, and removing the photoresist in other regions so as to obtain a photoresist pattern. The thickness of the photoresist in the first region 121 is larger than the thickness of the photoresist in the second region 122 shown in FIG. 7 and FIG. 8.

Figure 9:
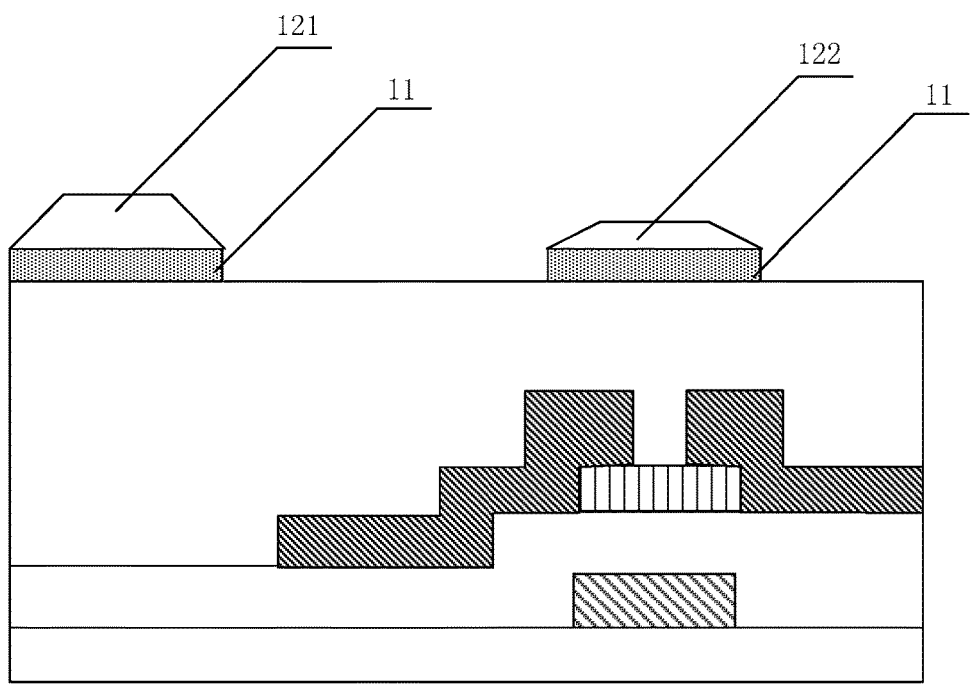

S63, using the photoresist pattern to etch off the transparent metal oxide layer 11 uncovered in other regions, as shown in FIG. 9.

Figure 10:
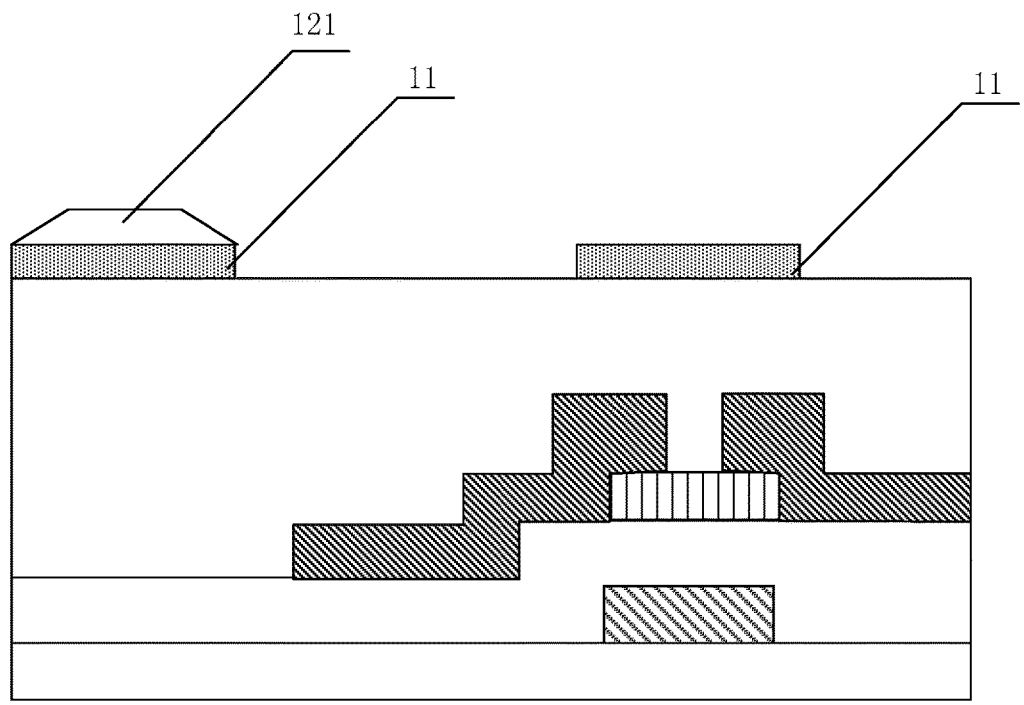

S64: removing the photoresist in the second region 122 and reducing the thickness of the photoresist in the first region 121 through one ashing process as shown FIG. 10.

Figure 11:
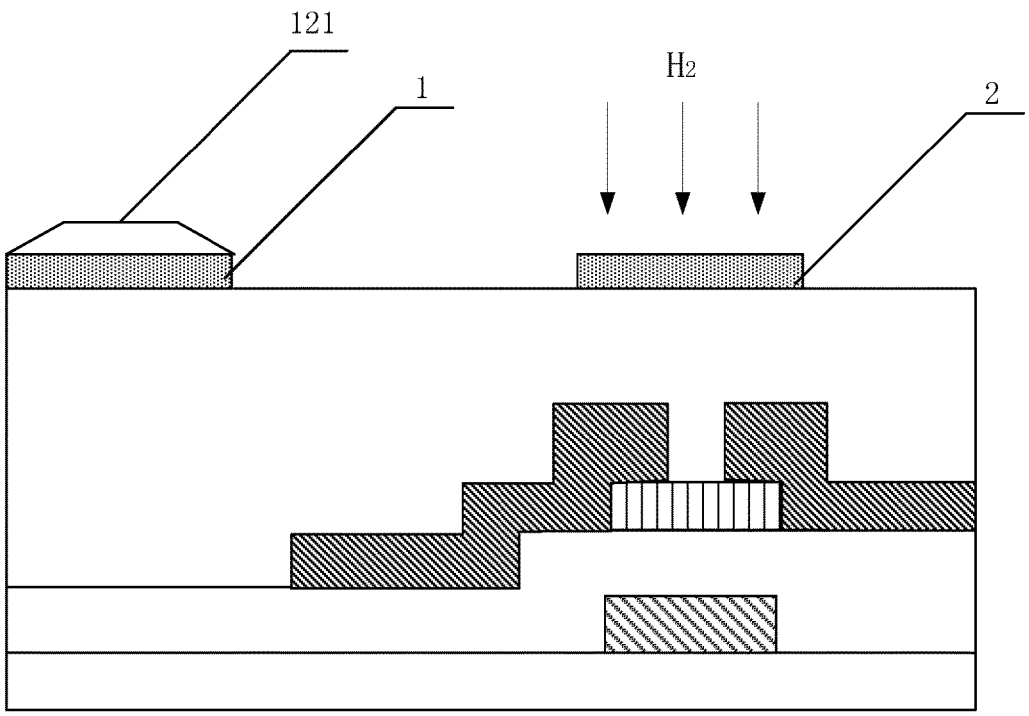
Figure 12:
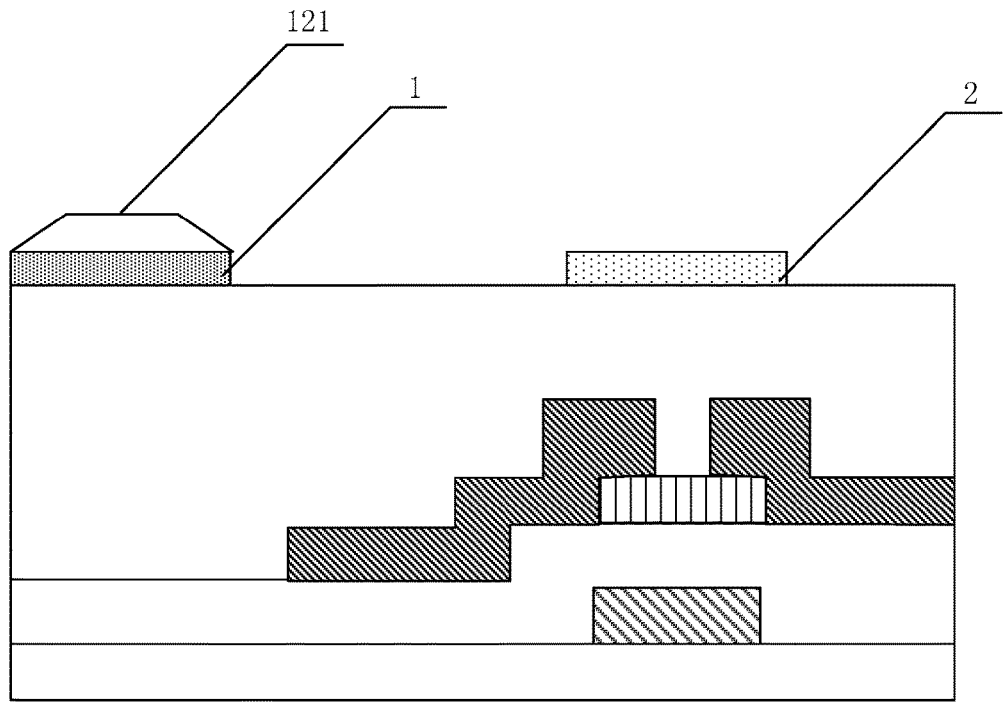
Figure 13:
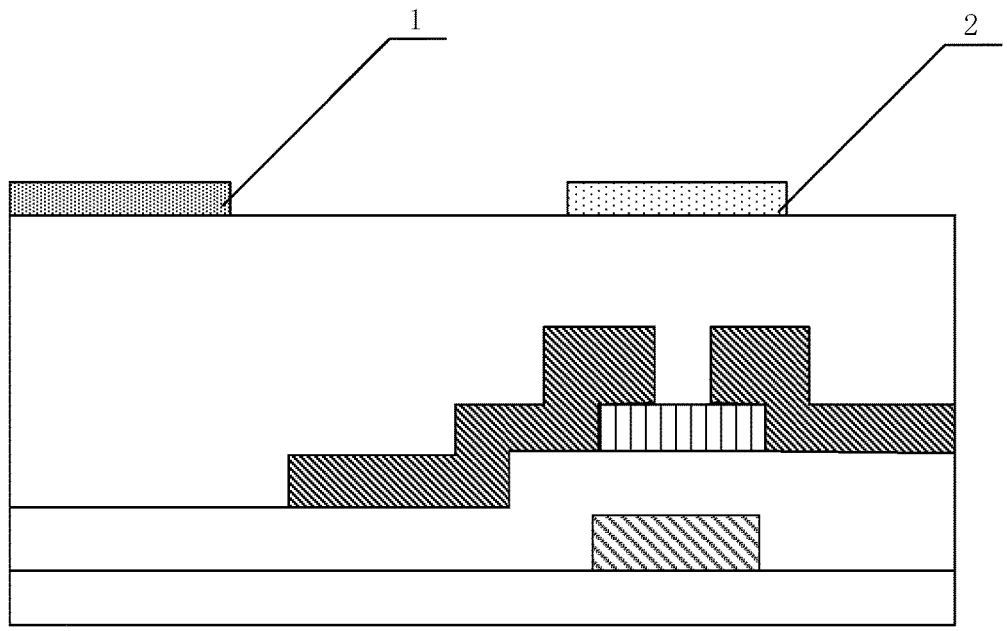

S65: using the remained photoresist pattern to process the transparent metal oxide layer in the second region by reduction gas (for example $H_2$) plasma, so as to obtain a metal layer from the transparent metal oxide layer in the second region. For example the transparent metal oxide is transparent indium tin oxide, the metal indium can be obtained after the reducing process, as shown in FIG. 11 and FIG. 13, the transparent metal oxide layer in the first region is used as the common electrode 1, and the metal layer in the second region is used as the top-gate electrode 2.

S66: removing the photoresist 121 on the common electrode 1.

By using the half tone mask exposure process, the exposed transparent metal oxide layer in the second region and the non-exposed transparent metal oxide layer in the first region can be obtained easily. Therefore, only the transparent metal oxide layer in the second region is reduced to increase the content of metal or obtain a metal layer, and the transparent metal oxide layer in the first region remains unchanged.

As shown in FIG. 4 and FIG. 5, the dual-gate TFT array substrate according to an embedment of the present disclosure comprises a common electrode and a top-gate electrode, and the common electrode 1 and the top-gate electrode 2 are disposed in the same layer.

For example, the dual-gate TFT array substrate further comprises: a substrate 10; a bottom-gate electrode and a gate line 8 disposed on the substrate 10; a gate insulating layer 9 disposed on the bottom-gate electrode and the gate line 8; an active layer 6 disposed on the gate insulating layer 9; source/drain electrodes 7 disposed on the active layer 6, and a first passivation layer 5 disposed on the source drain layer 7. The common electrode 1 and the top-gate electrode 2 are formed on the first passivation layer 5. The source/drain electrodes comprise a source electrode and a drain electrode.

Furthermore, the dual-gate TFT array substrate may further comprise a via hole formed at a region corresponding to the gate line 8 in both the first passivation layer 5 and the gate insulating layer 9, and the via hole is used to connect the top-gate electrode 2 with the gate line 8.

Furthermore, for example, the dual-gate TFT array substrate may further comprise: a second passivation layer 4 disposed on the common electrode 1 and the top-gate electrode 2; and a pixel electrode 3 disposed on the second passivation layer 4.

Furthermore, for example, the active layer of the dual-gate TFT array substrate may be made of IGZO.

Furthermore, for example, the common electrode 1 may be made of indium tin oxide, and the top-gate electrode 2 may be made of metal indium that is obtained by reducing indium tin oxide.

Furthermore, for example, the common electrode 1 is made of transparent indium tin oxide, and the top-gate electrode 2 is formed by reducing indium tin oxide.

The processes adopted by the above flow comprise: a film forming process such as deposition, sputtering, etc., and a patterning process such as photolithography, etching, etc.

A display device according to an embodiment of the present disclosure comprises the above dual-gate TFT array substrate.

It should be noted that the display device in the embodiment can be any products or components having display function such as: an electronic paper, a mobile phone, a tablet computer, a television, a notebook computer, a digital photo frame, a navigator, etc.

The technical solutions of the present disclosure are described above in detail in connection with the drawings. Considering the complexity of the manufacturing process of the TFT array substrate in the existing technology that the common electrode is made first and then the top-gate electrode is made, the technical solutions of the present disclosure use same one patterning process to form the top-gate electrode together with the common electrode. Compared with the traditional process that the common electrode is formed first and then the top-gate electrode is formed, in the present disclosure, the times of the patterning process is reduced and the process flow is simplified. At the same time, in the dual-gate TFT array substrate of the present disclosure, the resistance of the top-gate electrode obtained by reducing the transparent metal oxide is similar to the resistance of the bottom-gate electrode, which ensures the stability of the dual-gate TFT and the stability over the entire array substrate.

What are described above is related to the illustrative embodiments of the disclosure only and not limitative to the scope of the disclosure; the scopes of the disclosure are defined by the accompanying claims.

The present application claims the priority of the Chinese Patent Application No. 201610040520.4 filed on Jan. 21, 2016, the entirety of which is incorporated herein by reference as a part of the present application.

What is claimed is:

1. A manufacturing method of a dual-gate thin film transistor (TFT) array substrate, comprising:
    forming a common electrode and a top-gate electrode through one patterning process with transparent metal oxide; and
    reducing the top-gate electrode,
    wherein the forming the common electrode and the top-gate electrode and the reducing the top-gate electrode comprise:
    forming a transparent metal oxide layer;
    forming a photoresist layer on the transparent metal oxide layer;
    conducting an exposing process with a half tone mask on the photoresist layer, developing the exposed photoresist layer to retain photoresist in a first region and part of photoresist in a second region, and removing photoresist in rest regions;
    etching off the transparent metal oxide layer in the rest regions;
    removing the photoresist in the second region and reducing a thickness of the photoresist in the first region through one ashing process; and
    conducting a reduction gas plasma surface treatment on the transparent metal oxide layer in the second region to obtain a metal layer from the transparent metal oxide layer in the second region, wherein the transparent metal oxide layer in the first region is used as the common electrode, and the metal layer in the second region is used as the top-gate electrode.

2. The manufacturing method of the dual-gate TFT array substrate according to claim 1, before forming the common electrode and the top-gate electrode, further comprising:
    forming a bottom-gate electrode and a gate line on a substrate;
    forming a gate insulating layer on the bottom-gate electrode and the gate line;
    forming an active layer on the gate insulating layer;
    forming a source electrode and a drain electrode on the active layer; and
    forming a first passivation layer on the source electrode and the drain electrode;
    wherein the common electrode and the top-gate electrode are formed on the first passivation layer.

3. The manufacturing method of the dual-gate TFT array substrate according to claim 2, further comprising:
    forming a via hole at a region corresponding to the gate line in both the first passivation layer and the gate insulating layer, wherein the top-gate electrode and the gate line are connected through the via hole.

4. The manufacturing method of the dual-gate TFT array substrate according to claim 2, wherein the active layer of the dual-gate TFT array substrate is made of indium gallium zinc oxide (IGZO).

5. The manufacturing method of the dual-gate TFT array substrate according to claim 1, further comprising:
　　forming a second passivation layer on the common electrode and the top-gate electrode; and
　　forming a pixel electrode on the second passivation layer.

* * * * *